United States Patent [19]

Gardner et al.

[11] Patent Number: 5,656,518

[45] Date of Patent: Aug. 12, 1997

[54] METHOD FOR FABRICATION OF A NON-SYMMETRICAL TRANSISTOR

[75] Inventors: Mark I. Gardner, Cedar Creek; Daniel Kadosh; Derick J. Wristers, both of Austin, all of Tex.

[73] Assignee: Advanced Micro Devices, Inc., Austin, Tex.

[21] Appl. No.: 713,386

[22] Filed: Sep. 13, 1996

[51] Int. Cl.$^6$ ............................................. H01L 21/8234
[52] U.S. Cl. ........................... 438/286; 438/305; 438/595
[58] Field of Search ............................. 437/44, 41 AS, 437/40 AS, 41 SW, 40 SW

[56] References Cited

U.S. PATENT DOCUMENTS

| | | | |
|---|---|---|---|
| 5,286,664 | 2/1994 | Horiuchi | 437/44 |
| 5,424,229 | 6/1995 | Oyamatsu | 437/35 |
| 5,547,885 | 8/1996 | Ogoh | 437/41 AS |

*Primary Examiner*—Chandra Chaudhari
*Assistant Examiner*—Toniae M. Thomas

*Attorney, Agent, or Firm*—Skjerven, Morrill, MacPherson, Franklin & Friel; David M. Sigmond; M. Kathryn Tsirigotis

[57] ABSTRACT

In the present invention, a method for fabrication of a non-symmetrical LDD-IGFET is described. The present invention includes a gate insulator and a gate electrode, such as a polysilicon, formed over a semiconductor substrate, the gate electrode having a top surface and opposing first and second sidewalls. A first dopant is implanted to provide a lightly doped drain region substantially aligned with the second sidewall. An oxide layer provides first and second sidewall oxide regions adjacent the first and second sidewalls, respectively. The first sidewall oxide region is isolated using a nitride layer having a window which exposes the second sidewall oxide region. Thermal oxidation is applied to the second sidewall oxide region wherein the size of the second sidewall oxide region increases while the size of the first sidewall oxide region remains substantially constant. The first sidewall oxide region is then exposed by removing the nitride layer and a second dopant is implanted to provide a heavily doped drain region substantially aligned with the outside edge of the second sidewall oxide region and a heavily doped source region.

28 Claims, 3 Drawing Sheets

METHOD FOR FABRICATION OF A NON-SYMMETRICAL TRANSISTOR

BACKGROUND OF THE INVENTION

U.S. patent application Ser. No. 08/713,388, entitled "Method For Fabrication Of A Non-Symmetrical Transistor", (Gardner, et al.) is filed concurrently herewith and incorporated by reference.

1. Field of the Invention

The present invention relates to integrated circuits, and more particularly to lightly doped drain insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate. The gate electrode is separated from the semiconductor substrate by a thin sidewall oxide layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate electrode and the source/drain regions. Heavily doped polysilicon (also called polycrystalline silicon, poly-Si or poly) thin films are used as the gate electrode. Since polysilicon has the same high melting point as a silicon substrate, it can be deposited prior to source and drain formation. The polysilicon is anisotropically etched through openings in a photoresist mask to provide a gate electrode which provides a mask during formation of the source and drain by ion implantation. Photolithography is frequently used to create patterns in the photoresist mask that define the gate electrode.

A number of techniques have been utilized to reduce hot carrier effects. The voltages applied to the device can be decreased or appropriate drain engineering design techniques, which result in special drain structures that reduce hot electron effects, can be implemented. One such technique is a lightly doped drain (LDD). LDDs distribute some of the potential into the drain and thus reduce the maximum electric field. The drain is typically formed by two ion implants. One of these is self-aligned to the gate electrode, and the other is self-aligned to the gate electrode on which sidewall oxide regions have been formed. The sidewall oxide regions are typically oxides, nitrides or oxy-nitrides. The purpose of the lighter first dose is to form a lightly doped region of the drain (or LDD) at the gate electrode sidewall near the channel, which can reduce the maximum electric field. The second heavier dose forms a low resistivity region of the drain, which is subsequently merged with the lightly doped region. Thereafter, electrical contacts are formed on the heavily doped region. Since the heavily doped region is farther away from the channel than a conventional drain structure, the depth of the heavily doped region can be made somewhat greater without adversely affecting the device characteristics. The lightly doped region is not necessary for the source (unless bi-directional current is used), however LDD structures are typically formed for both the drain and source to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET. The saturation drain current is affected little by the parasitic resistance of the drain region and greatly by the effective gate voltage drop due to the parasitic resistance of the source region. Reduction of the drain current can, therefore, be decreased by implementation of a non-symmetrical LDD-IGFET with a lightly doped region only at the drain. However, a non-symmetrical LDD-IGFET can further increase fabrication complexity.

One method for non-symmetrical LDD-MOSFET fabrication is U.S. Pat. No. 5,424,229 entitled "Method For Manufacturing MOSFET Having An LDD Structure" (Oyamatsu) which includes masking the substrate before the gate electrode is formed and leaving a window open in the mask. The lightly doped drain region is then implanted at an angle into the substrate through the window opening. The mask is removed and the gate electrode is formed in the window opening and over a portion of the lightly doped drain region. The heavily doped regions are then formed aligned with the sidewalls of the gate electrode. However, implanting doped regions at an angle into the substrate increases fabrication complexity.

Another method is U.S. Pat. No. 5,286,664 entitled "Method For Fabricating The LDD-MOSFET" (Horiuchi) wherein the gate electrode is formed and then one half of the gate electrode (on the source side) is masked with a photoresist mask. The lightly doped drain region is implanted. Then a single sidewall oxide region is formed on the drain side using a liquid phase deposition (LPD) method for depositing silicon dioxide. The mask is then removed and the heavily doped regions are implanted. The LPD method however is not precise and can make controlling the thickness or size of the sidewall oxide region difficult.

Accordingly, there is a need for a non-symmetrical LDD-IGFET which decreases the parasitic resistance, therefore increasing drain current, which can be precisely fabricated.

SUMMARY OF THE INVENTION

In the present invention, a method for fabrication of a non-symmetrical LDD-IGFET is described. The present invention includes a gate insulator and a gate electrode, such as a polysilicon, formed over a semiconductor substrate, the gate electrode having a top surface and opposing first and second sidewalls. A first dopant is implanted to provide a lightly doped drain region substantially aligned with the second sidewall. An oxide layer provides first and second sidewall oxide regions adjacent the first and second sidewalls, respectively. The first sidewall oxide region is isolated using a nitride layer having a window which exposes the second sidewall oxide region. Thermal oxidation is applied to the second sidewall oxide region wherein the size of the second sidewall oxide region increases while the size of the first sidewall oxide region remains substantially constant. The first sidewall oxide region is then exposed by removing the nitride layer and a second dopant is implanted to provide a heavily doped drain region substantially aligned with the outside edge of the second sidewall oxide region and a heavily doped source region.

The present fabrication method of a non-symmetrical LDD IGFET provides the advantages described for non-symmetrical LDD IGFETs of enhanced speed performance and drive current while maintaining reliability. These and other features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
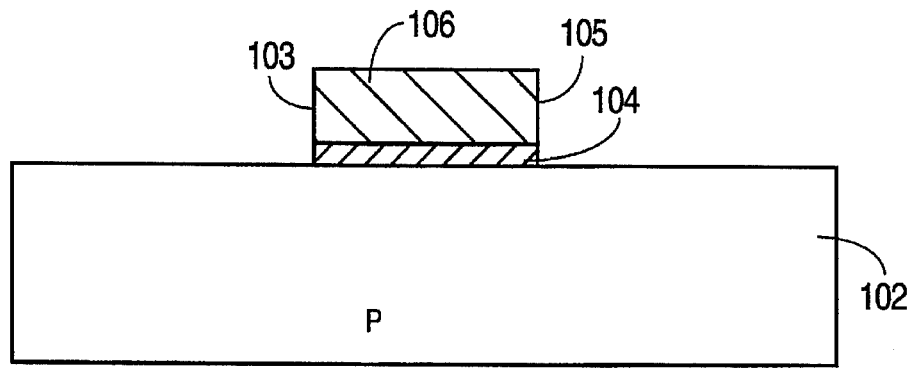
FIGS. 1A–1I show cross-sectional views of successive process steps for formation of an LDD IGFET in accordance with an embodiment of the invention.

In the drawings, depicted elements are not necessarily drawn to scale and like or similar elements may be designated by the same reference numeral throughout the several views.

FIGS. 1A–1I show cross-sectional views of successive process steps for formation of a non-symmetrical LDD IGFET in accordance with an embodiment of the invention. In FIG. 1A, a gate electrode such as polysilicon 106 is disposed on a gate oxide 104, which in turn is disposed on a semiconductor substrate 102 suitable for integrated circuit manufacture. For instance, substrate 102 includes a P-type planar epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using tube growth at a temperature of 700° to 1,000° C. in an $O_2$ containing ambient. Gate oxide 104 has a thickness in the range of 30 to 200 angstroms.

Thereafter, a blanket layer of polysilicon 106 is deposited by low pressure chemical vapor deposition (LPCVD) on the top surface of gate oxide 104. Polysilicon 106 has a thickness in the range of 250 to 4,000 angstroms. Polysilicon 106 can be undoped or doped, either after deposition by diffusion or ion implantation or in-situ during deposition. In the present invention, doping of the polysilicon 106 enhances polysilicon oxidation applied in the step described in FIG. 1G below. Undoped polysilicon 106 oxidizes more rapidly than the semiconductor substrate 102, usually a single crystal silicon. However, if the polysilicon 106 is heavily doped with an N-type dopant, such as arsenic or phosphorus, the oxidation growth rate on the polysilicon 106 is greatly enhanced. Generally, the higher the dopant concentration, the more enhanced the oxidation growth rate. For instance, polysilicon 106 is doped by ion implantation of arsenic at a dose in the range of $1 \times 10^{15}$ to $5 \times 10^{15}$ atoms/cm$^2$ and an energy in the range of 2 to 80 kiloelectron-volts.

Thereafter, polysilicon 106 and gate oxide 104 are patterned using photolithography and an isotropic dry etch. For submicron dimensions, patterning a photoresist mask (not shown) by I-line photolithography using a mercury vapor lamp is preferred. After the photoresist mask is patterned and an anisotropic etch is applied, polysilicon 106 is etched back to provide a gate electrode and gate oxide 104 is etched back to provide a gate insulator. Preferably, a first etchant is applied that is highly selective of polysilicon, then a second etchant is applied that is highly selective of oxides. After etching occurs, polysilicon 106 includes substantially vertical opposing first and second sidewalls 103 and 105, respectively. The gate oxide 104 is substantially aligned with the first and second sidewalls 103 and 105.

Figure 1B:
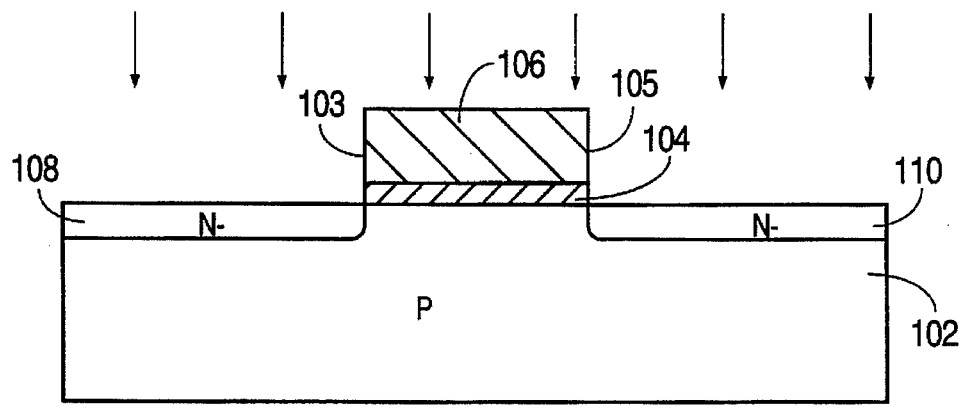

In FIG. 1B, a light dose of a first dopant is implanted into the semiconductor substrate 102 to provide a lightly doped source region 108 and a lightly doped drain region 110. For instance, the structure is subjected to ion implantation of arsenic at a dose in the range of $1 \times 10^{13}$ to $5 \times 10^{14}$ atoms/cm$^2$ and an energy in the range of 2 to 80 kiloelectron-volts. As a result, the lightly doped source region 108, substantially aligned with the first sidewall 103, and the lightly doped drain region 110, substantially aligned with the second sidewall 105, are formed at and below the surface of substrate 102. Lightly doped source and drain regions 108 and 110, respectively, are doped N- with a dopant concentration in the range of about $1 \times 10^{17}$ to $1 \times 10^{18}$ atoms/cm$^3$, and a junction depth in the range of 0.01 to 0.15 microns.

Figure 1C:
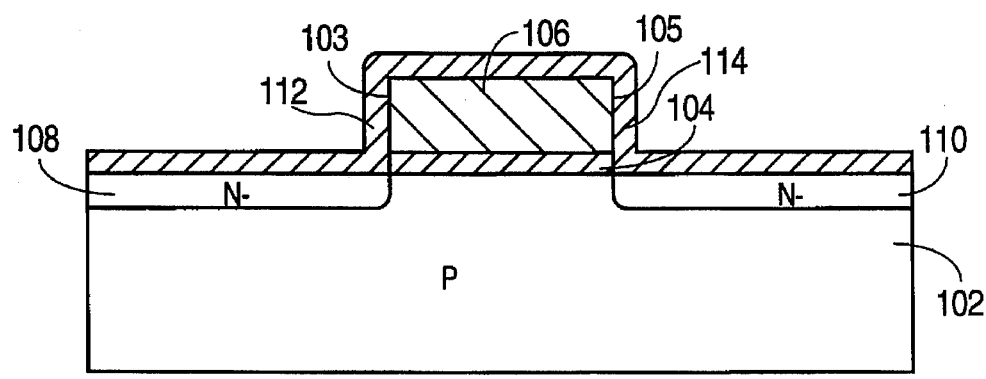

In FIG. 1C an oxide layer (such as $SiO_2$) is formed on the whole surface of the resultant structure using tube growth at a temperature of 700° to 1,000° C. in an $O_2$ containing ambient and has a thickness in the range of 100 to 500 angstroms. The oxide layer provides a first sidewall oxide region 112 adjacent the first sidewall 103 and a second sidewall oxide region 114 adjacent the second sidewall 105. The first and second sidewall oxide regions 112 and 114, respectively, are essentially identical in size and each extend a lateral distance in the range of 100 to 500 angstroms.

Figure 1D:
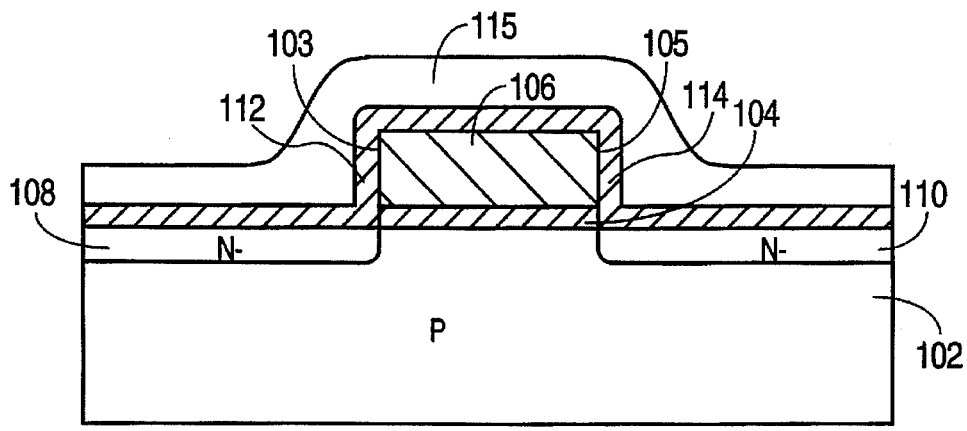
Figure 1E:
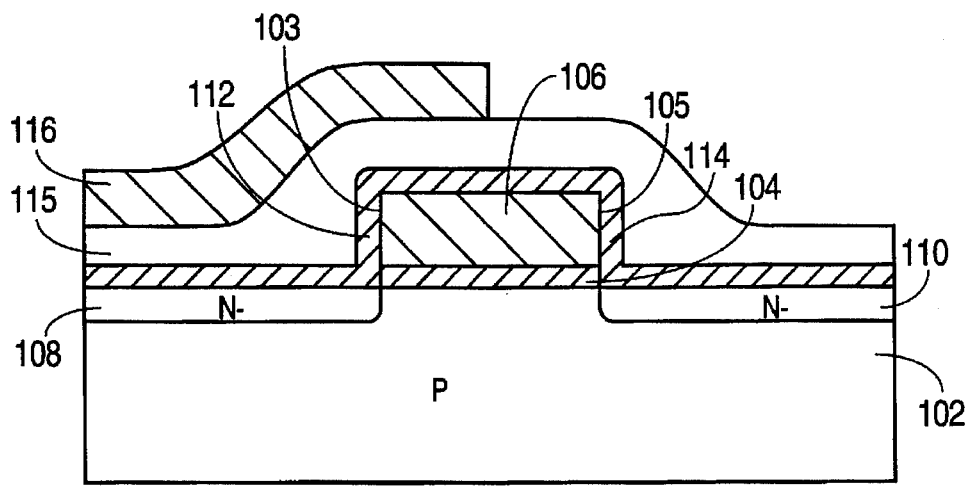

In FIG. 1D a nitride layer 115, such as silicon oxy-nitride or silicon containing nitride, is formed on the whole surface of the resultant structure. The nitride layer 115 is deposited by plasma deposition at a temperature range of room temperature to 350° C. or by LPCVD at a temperature range of 600° to 900° C. The nitride layer 115 has a thickness in the range of 200 to 2,000 angstroms. In FIG. 1E, a masking fill 116, such as a photoresist film, is formed on the nitride layer 115 above the first sidewall oxide region 112, the masking film 116 having an opening which exposes the nitride layer 115 over a portion of the top surface of the polysilicon 106, the second sidewall oxide region 114 and the second sidewall 105, and the semiconductor substrate 102 outside of the second sidewall 105.

Figure 1F:
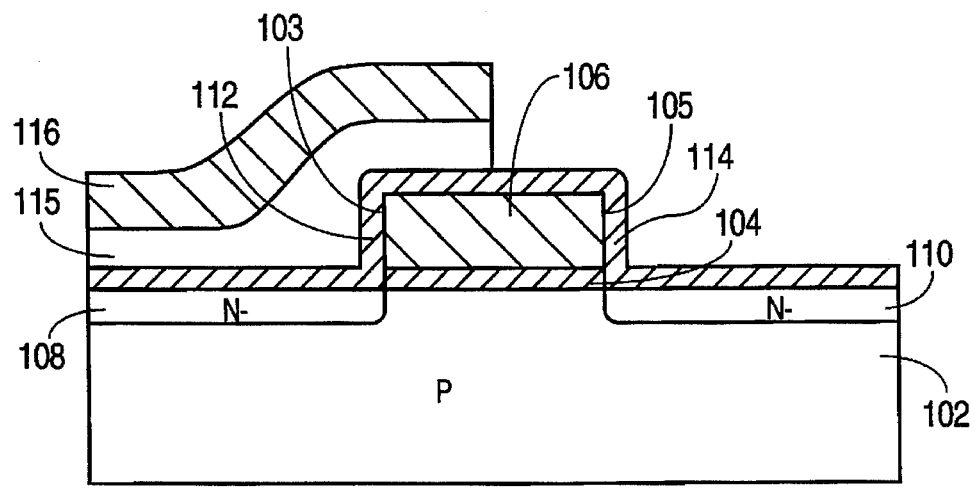

As shown in FIG. 1F, the nitride layer 115 exposed through the opening in the masking fill 116 is etched with a wet or dry etch that is highly selective of nitride to provide an opening in the nitride layer 115 which exposes the second sidewall oxide region 114 and the oxide layer over a portion of the top surface of the polysilicon 106 and over the semiconductor substrate 102 outside of the second sidewall 105 and wherein the nitride layer 115 covers the first sidewall oxide region 112.

Figure 1G:
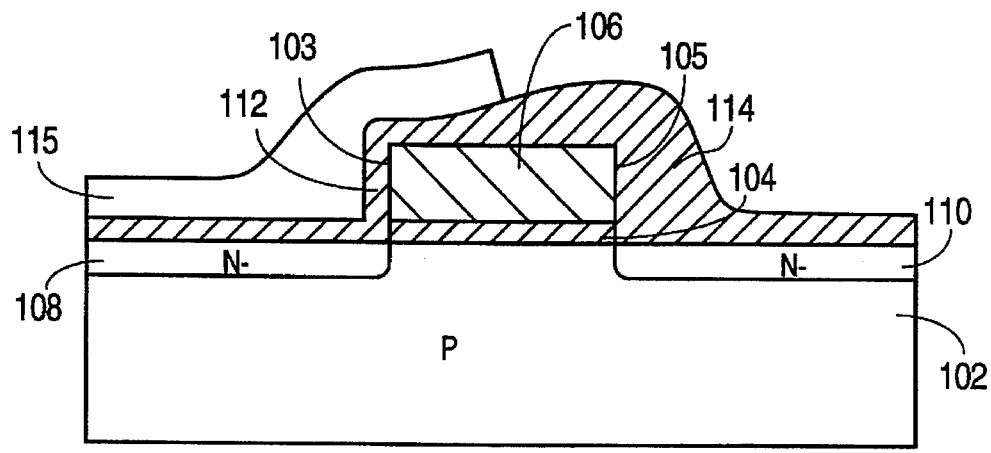

In FIG. 1G, the masking film 116 is removed and the size of the second sidewall oxide region 114 is increased while the size of the first sidewall oxide region 112 remains substantially constant. As illustrated in FIG. 1G, the first sidewall oxide region 112 is isolated by the nitride layer 115. Selective thermal oxidation is applied to the oxide layer exposed through the opening in the nitride layer 115 wherein the second sidewall oxide region 114 increases in size and the first sidewall oxide region 112 remains substantially constant in size. For instance, the resultant structure is put into an $H_2O$ or $O_2$ containing ambient and oxide is thermally grown at temperatures in the range of 800° to 1000° C. The nitride layer 115 prevents oxidation of the first sidewall oxide region 112. The oxide grows where there is no masking nitride layer 115. Furthermore, at the edge of the nitride layer 115, as illustrated in FIG. 1G, some oxidant diffuses laterally causing the oxide to grow under and lift the nitride layer 115 edge adjacent to the opening in the nitride layer 115.

In this thermal oxidation step, the oxidation growth rate of the second sidewall oxide region 114 is greater than the oxidation growth rate of the substrate 102 due to enhanced polysilicon oxidation. The polysilicon 106 may be doped after deposition during the implant of the first dopant into the substrate 102 (see FIG. 1B) which is sufficient to increase the oxide of the second sidewall oxide region 114 to extend a lateral distance in the range of 500 to 700 angstroms. However, a heavier dose of dopant implanted into the polysilicon 106 (see FIG. 1A) is preferred in attaining a lateral distance in the range above 700 angstroms up to 1500 angstroms.

Figure 1H:
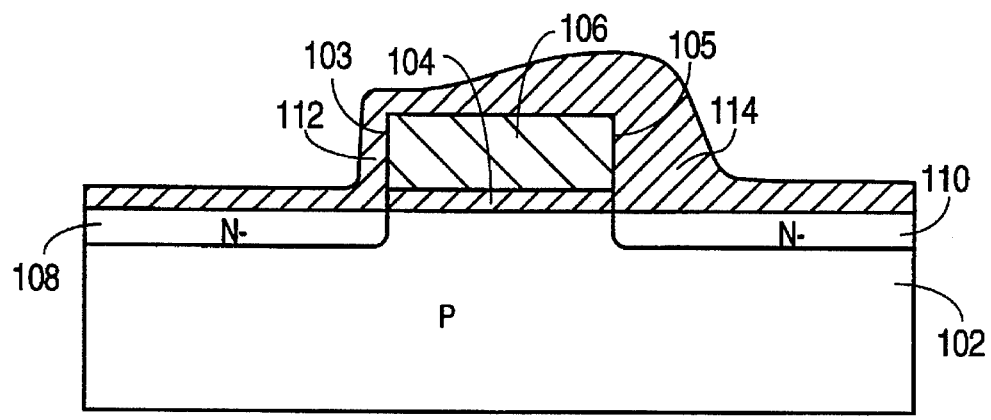
Figure 1I:
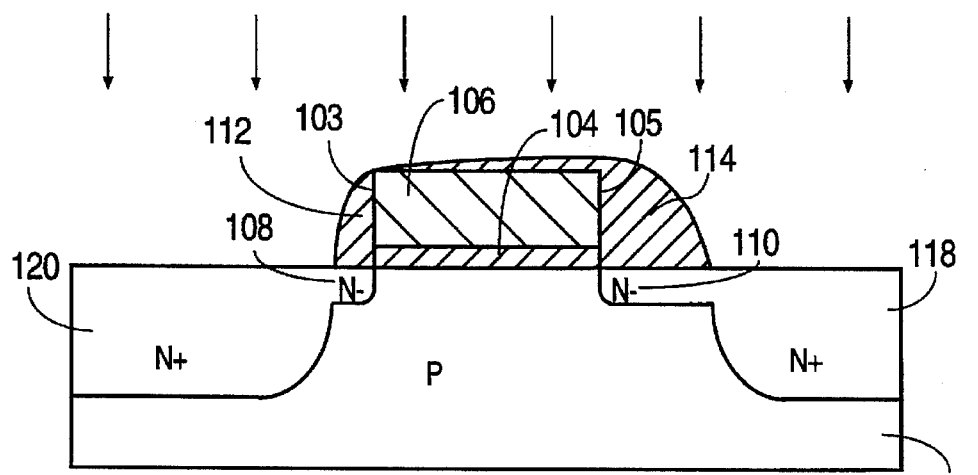

In FIG. 1H, the nitride layer 115 is removed with an etchant that is highly selective of nitride. In FIG. 1I, the oxide layer which includes the first sidewall oxide region 112 and the second sidewall oxide region 114 is partially etched back to provide a more uniform surface on the resultant structure. Either a dry or wet chemical etch may be used. The first sidewall oxide region 112 may be removed entirely during the etching process (not shown) or a portion thereof may be left in place. In either case, at least a portion of the second sidewall oxide region 114 remains. A heavy dose of a second dopant is then implanted into the substrate 102 to provide a heavily doped drain region 118 adjacent to and outside the second sidewall oxide region 114 and a heavily doped source region 120 adjacent to and outside the first sidewall oxide region 112. The heavily doped drain region 118 and heavily doped source region 120 are formed in substrate 102 using the polysilicon 106, the first sidewall oxide region 112 and the second sidewall oxide region 114 as implant masks. The implant is performed using arsenic at a dosage of $1\times10^{15}$ to $5\times10^{15}$ atoms/cm$^2$ and an energy in the range of 2 to 80 kiloelectron-volts. As a result, the heavily doped drain region 118 and heavily doped source region 120 are formed at and below the surface of substrate 102 and are doped N+with a dopant concentration in the range of $1\times10^{18}$ to $1\times10^{19}$ atoms/cm$^3$, and a depth in the range of 0.02 to 0.3 microns. The heavily doped drain region 118 and the lightly doped drain region 110 together form a drain in the semiconductor substrate 102. The entire lightly doped source region 108, an N−region, is converted into an N+region and effectively eliminated if the first sidewall oxide region 112 is removed before implanting the second dopant. However, if the first sidewall oxide region 112, or a portion thereof, is left in place during the implant of the second dopant, then a portion of the lightly doped source region 108 remains beneath the first sidewall oxide region 112 and the resistance of the source in the semiconductor substrate 102 is higher than it would be had the entire lightly doped source region 108 been converted.

The present invention is well-suited for forming P-channel MOSFETs as well as N-channel MOSFETs. Boron is a commonly used P-type dopant. For instance, for the lightly doped regions the structure is subjected to ion implantation of boron at a dose in the range of $1\times10^{13}$ to $5\times10^{14}$ atoms/cm$^2$ and an energy in the range of 5 to 50 kiloelectron-volts. For the heavily doped regions the structure is subjected to ion implantation of boron at a dose in the range of $1\times10^{15}$ to $5\times10^{15}$ atoms/cm$^1$ and an energy in the range of 2 to 50 kiloelectron-volts. Boron tends to diffuse much faster than typical N-type dopants, therefore, when boron is the dopant, it is preferable to use the oxide layer (see FIG. 1C) in the higher thickness range to impede diffusion of the boron at the elevated temperatures needed for the later thermal oxidation step (see FIG. 1G). Therefore, the fabrication method of the present invention is advantageous for fabrication of P-channel LDD IGFETs.

A rapid thermal anneal (RTA) is performed after implanting the first dopant and again after implanting the second dopant. The RTA is performed at a temperature range of 950° to 1050° C. for 10 to 30 seconds for N-type dopants and 800° to 1000° C. for 10 to 30 seconds for P-type dopants.

Further processing steps in the fabrication of IGFETs typically include forming a thick oxide layer over the active regions, forming contact windows in the oxide layer above the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

The present invention includes variations to the embodiments described above. N-type or P-type dopants can be used in any of the embodiments described above, and the dopants can be activated by applying various combinations of heat and pressure. Suitable N-type dopants include arsenic and phosphorus; suitable P-type dopants include boron, including boron $B_{10}$ and boron $B_{11}$, and $BF_x$ species such as $BF_2$.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

Variations and modifications of the embodiments disclosed herein may be made based on the description set forth herein, without departing from the scope and spirit of the invention as set forth in the following claims.

What is claimed is:

1. A method for fabrication of a non-symmetrical IGFET, comprising the steps of:

forming a gate insulator and a gate electrode over a semiconductor substrate, the gate electrode having a top surface and opposing first and second sidewalls;

implanting a first dopant into the semiconductor substrate to provide a lightly doped drain region substantially aligned with the second sidewall;

forming a first sidewall oxide region and a second sidewall oxide region adjacent the first and second sidewalls, respectively;

increasing the size of the second sidewall oxide region while the size of the first sidewall oxide region remains substantially constant; and then implanting a second dopant into the semiconductor substrate to provide a heavily doped source region and a heavily doped drain region.

2. The method of claim 1 wherein the heavily doped source region is substantially aligned with the outside edge of the first sidewall oxide region and the heavily doped drain region is substantially aligned with the outside edge of the second sidewall oxide region.

3. The method of claim 1 wherein implanting the first dopant provides a lightly doped source region and wherein implanting the second dopant converts at least a portion of the lightly doped source region into the heavily doped source region.

4. The method of claim 1 further comprising removing the first sidewall oxide region before implanting the second dopant.

5. The method of claim 4 wherein implanting the second dopant provides a heavily doped source region substantially aligned with and outside of the first sidewall and a heavily doped drain region substantially aligned with the outside edge of the second sidewall oxide region.

6. The method of claim 1 wherein the step of increasing the size of the second sidewall oxide region comprises:
   isolating the first sidewall oxide region;
   thermally growing the second sidewall oxide region; and then exposing the first sidewall oxide region.

7. The method of claim 6 wherein the step of forming the first sidewall oxide region and the second sidewall oxide region comprises forming an oxide layer over the semiconductor substrate outside of the gate electrode, the top surface of the gate electrode and the first and second sidewalls of the gate electrode wherein the oxide layer adjacent the first and second sidewalls, respectively, provides the first and second sidewall oxide regions, respectively.

8. The method of claim 7 wherein the step of isolating the first sidewall oxide region comprises:
   forming a nitride layer over the oxide layer;
   forming a masking film on the nitride layer over the first sidewall oxide region, the masking film having an opening which exposes the nitride layer above the second sidewall oxide region and the second sidewall, a portion of the top of the gate electrode and the semiconductor substrate outside of the second sidewall;
   etching the portion of the nitride layer exposed through the opening in the masking film wherein an opening is provided in the nitride layer exposing the second sidewall oxide region and the oxide layer above a portion of the top of the gate electrode and the semiconductor substrate outside of the second sidewall and wherein the nitride layer covers the first sidewall oxide region; and
   removing the masking film.

9. The method of claim 8 wherein the step of thermally growing the second sidewall oxide region includes thermally growing the oxide layer exposed through the opening in the nitride layer.

10. The method of claim 8 wherein the step of exposing the first sidewall oxide region comprises removing the nitride layer.

11. The method of claim 9 wherein thermally growing the oxide layer includes using an $O_2$ containing ambient.

12. The method of claim 9 wherein thermally growing the oxide layer includes using an $H_2O$ containing ambient.

13. The method of claim 9 wherein the gate electrode is a polysilicon and the semiconductor substrate is a single crystal silicon.

14. The method of claim 13 wherein the polysilicon is doped with an N-type dopant to provide enhanced polysilicon oxidation wherein the oxidation growth rate of the second sidewall oxide region is greater than the oxidation growth rate of the oxide layer over the single crystal silicon adjacent to the second sidewall oxide region on the side opposite the polysilicon.

15. The method of claim 1 farther comprising:
   performing a rapid thermal anneal after implanting the first dopant; and
   performing a rapid thermal anneal after implanting the second dopant.

16. The method of claim 14 further comprising performing a rapid thermal anneal after doping the polysilicon.

17. The method of claim 1 wherein the lightly doped drain region, the heavily doped drain region and the heavily doped source region are n-type regions.

18. The method of claim 1 wherein the lightly doped drain region, the heavily doped drain region and the heavily doped source region are p-type regions.

19. The method of claim 1 wherein the gate insulator is an oxide.

20. The method of claim 8 wherein the nitride layer is a silicon oxy-nitride.

21. The method of claim 8 wherein the nitride layer is a silicon containing nitride.

22. The method of claim 8 wherein the masking film is a photoresist.

23. A method for fabrication of a non-symmetrical IGFET, comprising the steps of:
   (1) forming a gate insulator and a gate electrode over a semiconductor substrate, the gate electrode having a top surface and opposing first and second sidewalls;
   (2) implanting a first dopant into the semiconductor substrate to provide a lightly doped drain region substantially aligned with the second sidewall;
   (3) forming an oxide layer over the semiconductor substrate outside of the gate electrode, the top surface of the gate electrode and the first and second sidewalls of the gate electrode wherein the oxide layer adjacent the first and second sidewalls, respectively, provides first and second sidewall oxide regions, respectively;
   (4) isolating the first sidewall oxide region;
   (5) thermally growing the oxide of the second sidewall oxide region wherein the size of the second sidewall oxide region increases while the size of the first sidewall oxide region remains substantially constant;
   (6) exposing the first sidewall oxide region; and
   (7) implanting a second dopant into the semiconductor substrate to provide a heavily doped source region and a heavily doped drain region.

24. The method of claim 23 wherein the heavily doped source region is substantially aligned with the outside edge of the first sidewall oxide region and the heavily doped drain region is substantially aligned with the outside edge of the second sidewall oxide region.

25. The method of claim 23 wherein implanting the first dopant provides a lightly doped source region and wherein implanting the second dopant converts at least a portion of the lightly doped source region into the heavily doped source region.

26. The method of claim 23 wherein the step of isolating the first sidewall oxide region comprises:
   forming a nitride layer over the surface of the oxide layer;
   forming a photoresist film that covers the nitride layer above the first sidewall oxide region and exposes the nitride layer above the second sidewall oxide region;
   etching the portion of the nitride layer exposed through the opening in the photoresist film; and
   removing the photoresist film.

27. The method of claim 26 wherein the step of exposing the first sidewall oxide region comprises removing the nitride layer.

28. A method for fabrication of a non-symmetrical IGFET comprising the of steps of:
   providing a semiconductor substrate;
   forming a gate oxide on the semiconductor substrate;
   forming, on the gate oxide, a polysilicon electrode having a top surface and opposing first and second sidewalls;

implanting a first dopant into the semiconductor substrate to provide a lightly doped drain region substantially aligned with the second sidewall and a lightly doped source region substantially aligned with the first sidewall;

forming an oxide layer over the semiconductor substrate outside of the polysilicon electrode, the top surface of the polysilicon electrode and the first and second sidewalls wherein the oxide layer adjacent the first and second sidewalls provides first and second sidewall oxide regions, respectively;

forming a nitride layer over the oxide layer;

forming a photoresist film that covers the nitride layer above the first sidewall oxide region and exposes the nitride layer above the second sidewall oxide region;

etching the portion of the nitride layer exposed through the opening in the photoresist film to provide an opening in the nitride layer wherein the second sidewall oxide region is exposed through the opening in the nitride layer and the first sidewall oxide region is isolated by the nitride layer;

removing the photoresist film;

thermally growing the second sidewall oxide region wherein the size of the second sidewall oxide region increases while the size of the first sidewall oxide region remains substantially constant;

removing the nitride layer; and then implanting a second dopant into the semiconductor substrate to provide a heavily doped drain region substantially aligned with the outside edge of the second sidewall oxide region and a heavily doped source region.

* * * * *